(12) United States Patent
Sanchez et al.

(10) Patent No.: US 7,268,588 B2
(45) Date of Patent: Sep. 11, 2007

(54) CASCADABLE LEVEL SHIFTER CELL

(75) Inventors: Hector Sanchez, Cedar Park, TX (US);
Carlos A. Greaves, Austin, TX (US);
Jim P. Nissen, Austin, TX (US);
Xinghai Tang, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 161 days.

(21) Appl. No.: 11/170,398

(22) Filed: Jun. 29, 2005

(65) Prior Publication Data

US 2007/0008001 A1     Jan. 11, 2007

(51) Int. Cl.
*H03K 19/094*     (2006.01)
(52) U.S. Cl. .............................. 326/68; 326/81; 326/86
(58) Field of Classification Search .................. 326/63, 326/68, 80–83, 86; 327/108–109, 333
See application file for complete search history.

(56) References Cited

U.S. PATENT DOCUMENTS

| 5,113,097 | A |   | 5/1992  | Lee |
|---|---|---|---|---|
| 5,450,357 | A |   | 9/1995  | Coffman |
| 5,650,742 | A |   | 7/1997  | Hirano |
| 5,698,993 | A |   | 12/1997 | Chow |
| 5,796,313 | A |   | 8/1998  | Eitan |
| 5,808,480 | A |   | 9/1998  | Morris |
| 5,969,542 | A | * | 10/1999 | Maley et al. .................. 326/81 |
| 6,242,962 | B1 |  | 6/2001  | Nakamura |
| 6,400,206 | B2 |  | 6/2002  | Kim et al. |
| 6,414,534 | B1 |  | 7/2002  | Wang et al. |

(Continued)

FOREIGN PATENT DOCUMENTS

EP     0 817 385 A1     1/1998

(Continued)

OTHER PUBLICATIONS

A high-voltage output driver in a standard 2.5 V 0.25 um CMOS technology; Serneels, B.; Piessens, T.; Stepert, M. Dehaene, W.; Solid-State Circuits Conference, 2004. Digest of Technical Papers. ISSCC. 2004 IEEE International, Feb. 15-19, 2004, pp. 146-518 vol. 1.

(Continued)

*Primary Examiner*—James H. Cho
*Assistant Examiner*—Jason Crawford
(74) *Attorney, Agent, or Firm*—Gary R. Stanford

(57) ABSTRACT

A level shifter circuit including first and second circuits and a protection layer. The first circuit receives an input signal and switches first and second nodes to opposite states within a first voltage range between first and second supply voltages. The second circuit switches the third and fourth nodes to opposite states within a second voltage range between third and fourth supply voltages in response to switching of the first and second nodes. The protection layer couples the first and second nodes to third and fourth nodes via respective first and second isolation paths. The isolation paths operate to keep the first and second nodes within the first voltage range and to keep the third and fourth nodes within the second voltage range. Isolation enables the use of thin gate-oxide devices for speed while extending the voltage range beyond the maximum voltage allowable for a single thin gate-oxide device.

18 Claims, 7 Drawing Sheets

U.S. PATENT DOCUMENTS

| | | |
|---|---|---|
| 6,456,110 B1 | 9/2002 | Elamanchili et al. |
| 6,483,366 B2 | 11/2002 | Ho |
| 6,489,828 B1 | 12/2002 | Wang et al. |
| 6,556,061 B1 | 4/2003 | Chen et al. |
| 6,672,769 B2 | 1/2004 | Toda et al. |
| 6,696,878 B1 | 2/2004 | Haskin |
| 6,774,696 B2 | 8/2004 | Clark et al. |
| 6,803,801 B2 | 10/2004 | Randazzo et al. |
| 6,819,159 B1 | 11/2004 | Lencioni |
| 2001/0011917 A1 | 8/2001 | Kim et al. |
| 2001/0043092 A1 | 11/2001 | McDaniel |
| 2002/0080651 A1 | 6/2002 | Tanzawa et al. |
| 2002/0084802 A1 | 7/2002 | Elamanchili et al. |
| 2002/0190776 A1 | 12/2002 | Wang et al. |
| 2003/0107425 A1 | 6/2003 | Yushan |
| 2003/0173994 A1 | 9/2003 | Lai et al. |
| 2004/0217798 A1 | 11/2004 | Lencioni |
| 2005/0012537 A1 | 1/2005 | Lee |
| 2005/0040852 A1 | 2/2005 | Mentze et al. |
| 2005/0040854 A1 | 2/2005 | Mentze et al. |
| 2007/0001716 A1 * | 1/2007 | Sanchez et al. ............. 327/112 |

FOREIGN PATENT DOCUMENTS

| | | |
|---|---|---|
| EP | 0817 387 A1 | 1/1998 |
| EP | 0880 230 A2 | 11/1998 |
| EP | 0 884 849 A2 | 12/1998 |
| EP | 0 886 379 A1 | 12/1998 |
| JP | 2002290230 | 10/2004 |

OTHER PUBLICATIONS

High-voltage-tolerant I/O buffers with low-voltage CMOS process; Singh, G.P.; Salem, R.B.' Solid-State Circuits, IEEE Journal of, vol. 34, Issue: 11, Nov. 1999 pp. 1512-1525.

An 8-Gb/s Capacitively Coupled Receiver With High Common-Mode Rejection for Uncoded Data; Maillard, X.; Kuijk, M.; Solid-State Circuits, IEEE Journal of , vol. 39, Issue: 11, Nov. 2004 pp. 1909-1915.

A low voltage to high voltage level shifter circuit for MEMS application; Pan, D.; Li, H.W.; Wilamowski, B.M.; University/Government/Industry Microelectronics Sumposium, 2003 . . . Proceedings of the 15th Blennial, Jun. 30-Jul. 2003 pp. 128-131.

Low power CMOS level shifters by bootstrapping technique; Tan, S.C.; Sun, X.W.; Electronics Letters, vol. 38, Issue: 16, Aug. 1, 2002; pp. 876-878.

Level shifters for high-speed 1V to 303 V interfaces in a 0.13 pm Cu-interconnection/low-k CMOS technology; Wen-Tai Wang; Ming-Dou Ker; Mi-Chang; Chung-Hui Chen; VLSI Technology, Systems, and Application, 2001. Proceedings of Technical Papers. 2001 International Suymposium on, Apr. 18-20, 2001 pp. 307-310.

A low voltage to high voltage level shifter in a low voltage, 0.25/spl mu/m PD DOI process; Mentze, E.J.; Buck, K.M.; Hess, H.L.; Cox, D.; Mojarradi, M.; VLSI, 2004. Proceedings. IEEE Computer society Annual Symposium on, Feb. 19-20, 2004 pp. 218-221.

A CMOS PLL Using Current-Adjustable Charge-Pump and On-Chip Loop Filter with Initialization Circuit Zhao-Hui, Ren Jonuan, Zhang Qianling, Asic and System State Key Lab, Fudan University, 200433, P.R. China pp. 728-731 Month: N/A Year: 2003.

* cited by examiner

US 7,268,588 B2

CASCADABLE LEVEL SHIFTER CELL

BACKGROUND OF THE INVENTION

1. Field of the Invention

The present invention relates in general to electronic devices, and more specifically to a cascadable level shifter cell with improved noise immunity.

2. Description of the Related Art

There exists the need for high-speed, point-to-point interface communications between lower chip level signals, e.g., 1 Volt (V) or less, and external circuits operating at higher voltage levels (e.g, 2.5V, 3.3V, or higher). Many systems include circuitry designed with a variety of technologies operating at multiple voltage levels. It has proved to be very challenging, however, to provide level shifting and output buffer circuits that interface multiple voltage levels while operating at the desired limits of the I/O speed. Process technologies, including CMOS processes, are continually improving resulting in smaller and faster devices, such as, for example, 90-nm CMOS. The smaller devices made with the newer technologies have relatively thin gate-oxide layers, which are faster than devices having relatively thick gate-oxide layers, but which are unable to withstand the higher voltage levels. Input/Output (I/O) architectures rely on devices having thicker gate-oxide layers to implement output drivers for safe operation. The larger devices, however, are slower and tend to slow down the I/O interface.

It is appreciated that the terms "thin" and "thick" are relative and that the actual thicknesses depend on the particular process technology and voltage levels employed. As used herein, the term "thin-gate" refers to thin gate-oxide devices that are suitable for the lower voltage ranges but that would break down if exposed to higher voltage levels. The term "thick-gate" refers to thick gate-oxide devices that are capable of being exposed to the higher voltage ranges. In the more specific embodiments illustrated herein, the lower voltage range is up to 1.2 V whereas the higher or full voltage range is between ground (0 V) and 3.3-3.6 V. It is understood, however, that the particular voltage levels and values are arbitrary and may change over time, such that what is now called "thin" may be considered "thick" by tomorrow's standards. The present invention transcends the particular voltage levels and ranges in that the configuration allows the lower voltage or thin-gate devices to be used in a buffer that switches higher voltage levels which would otherwise require higher voltage devices.

A conventional approach is to construct output buffers with a combination of thin-gate and thick-gate devices in an attempt to achieve a desired level of performance while isolating the thin-gate devices from the larger external supply voltages. Such drivers suffer from low performance, however, particularly at lower voltage levels of the chip. A simple conventional level shifter is implemented by linking two buffers or inverters together, a first coupled between a first voltage range and having an output coupled to the input of a second, which is coupled between a second and somewhat higher voltage range. Such conventional configuration is susceptible to noise in that any variation in switching voltage at the output of the first caused by noise or the like potentially results in failure to switch the second.

It is desired to implement level shifters and output buffers capable of operating between lower level chip voltages and higher voltage peripheral components and circuits that are less susceptible to noise.

BRIEF DESCRIPTION OF THE DRAWINGS

The benefits, features, and advantages of the present invention will become better understood with regard to the following description, and accompanying drawing in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
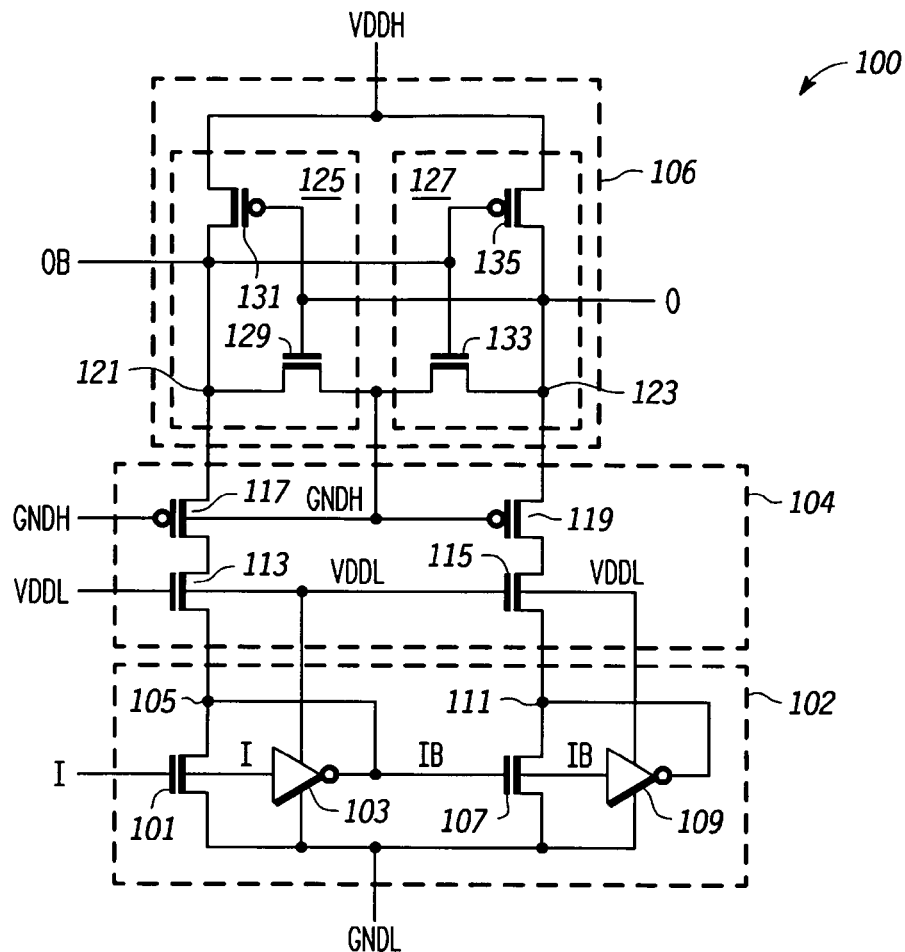
FIG. 1 is a schematic diagram of a up-shift circuit implemented according to an exemplary embodiment of the present invention.

FIG. 1 is a schematic diagram of an up-shift circuit 100 implemented according to an exemplary embodiment of the present invention. The up-shift circuit 100 includes a lower input circuit 102 coupled to an isolation or protection layer 104, which is further coupled to an upper output circuit 106. An input signal I is provided to the gate of an N-channel transistor 101 and to the input of an inverter 103 within the circuit 102. The inverter 103 has input power terminals coupled to a pair of lower voltage supplies VDDL and GNDL. The inverter 103 has an output coupled to a node 105, which is further coupled to the drain of transistor 101, to the gate of an N-channel transistor 107, and to the input of another inverter 109. The node 103 develops an inverted input signal IB, where a "B" appended to a signal name denoted a negative or inverted logic signal unless otherwise specified. The inverter 109 has power terminals coupled to the voltage supply references VDDL and GNDL and the sources of the transistors 101 and 107 are coupled to GNDL. The output of inverter 109 is coupled to a node 111, which is further coupled to the drain of transistor 107.

The protection layer 104 includes an N-channel transistor 113 having a source coupled to node 105 and another N-channel transistor 115 having a source coupled to node 111. VDDL is provided to the gates of transistors 113 and 115. The drain of transistor 113 is coupled to the drain of a P-channel transistor 117 and the drain of transistor 115 is coupled to the drain of another P-channel transistor 119. The source of transistor 117 is coupled to a node 121 and the source of transistor 119 is coupled to another node 123. The nodes 121 and 123 are coupled to the upper circuit 106, which operates between a pair of upper voltage supplies VDDH and GNDH. GNDH is provided to the gates of transistors 117 and 119. It is noted that the supplies GNDL and GNDH are reference voltage levels relative to VDDH and VDDL, respectively, and are "ground" signals in name only unless actually coupled to a circuit or chassis ground plane.

The circuit 106 includes a pair of cross-coupled inverters 125 and 127. The inverter 125 includes an N-channel transistor 129 and a P-channel resistor 131, each having drains coupled together forming an output of the inverter 125, which output is coupled to node 121. The gates of the transistors 129 and 131 are coupled together forming an input of the inverter 125, which input is coupled to node 123. The inverter 127 includes an N-channel transistor 133 and a P-channel resistor 135, each having drains coupled together forming an output of the inverter 127, which output is coupled to node 123 developing an output signal O. The gates of the transistors 133 and 135 are coupled together forming an input node of the inverter 127, which input is coupled to node 121. The sources of transistors 129 and 133 are coupled together at GNDH and the sources of transistors 131 and 133 are coupled together at VDDH. Node 121 develops an inverted output signal OB, such that when O goes high to VDDH, OB goes low to GNDH and vice-versa.

In operation of the up-shift circuit 100, the input signal I switches between GNDL and a voltage level at or near VDDL. Assuming I is initially low or logic "zero", the transistor 101 is turned off and the inverter 103 pulls node 105 high to VDDL. The transistor 107 is turned on and the transistor 107 and the inverter 109 pull the node 111 low to GNDL. Thus, when I is low, node 105 is high and node 111 is low. As described more fully below, GNDH is set greater than GNDL and may be the same voltage level as VDDL when using the up-shift circuit 100 to shift the voltage to a higher level. GNDH may be set equal to GNDL when using the up-shift circuit 100 as a delay device such as to match the delay of a corresponding up-shift circuit (see e.g., up-shift circuits 323, 325 and 327 in FIG. 3 in which GNDH=GNDL=GND). Node 111 pulled low to GNDL pulls node 123 low via transistors 115 and 119 of the protection layer 104. Although node 111 going low to GNDL might otherwise pull node 123 to GNDL, the transistor 119 receiving GNDH at its gate limits node 123 from falling below GNDH. Node 123 pulled low turns on transistor 131 and turns off transistor 129, so that node 121 is pulled high to VDDH via transistor 131. Node 121 pulled high turns on transistor 133 and turns off transistor 135, which facilitates pulling node 123 low in a bootstrap manner. In this manner, when I is low at GNDL, node 121 is high at VDDH and the non-inverted output node 123 is low at GNDH so that the output signal O is low at a voltage level of GNDH and the inverted output signal OB is high at VDDH.

When I goes high towards VDDL, the transistor 101 is turned on and the inverter 103 pulls its output low driving node 105 to GNDL. Node 105 going low turns off transistor 107 and causes inverter 109 to drive its output at node 111 high to VDDL. Node 105 going low tends to pull node 121 low whereas driving node 111 high pushes node 123 to a higher voltage level. Node 121 is pulled low towards GNDH turning on transistor 135 and turning off transistor 133, so that the inverter 127 pulls node 123 high to VDDH. Note that node 105 going low to GNDL might otherwise pull node 121 to GNDL, except that transistor 117 receiving GNDH at its gate prevents node 121 from falling below GNDH. Node 123 going high causes the inverter 125 to switch so that transistor 131 is turned off and transistor 129 is turned on. In this manner, I switched from low to high switches nodes 105 and 111 to opposite states between VDDL and GNDL, and this dual and complementary action causes the nodes 121 and 123 to opposite states between VDDH and GNDH thereby switching the output signals O and OB between VDDH and GNDH. In sum, the lower circuit 102 is responsive to the input signal I to switch nodes 105 and 111 to opposite states within the lower voltage range VDDL and GNDL, and the nodes 121 and 123 are responsive to nodes 105 and 111, respectively, causing them to switch to opposite states within the upper voltage range VDDH and GNDH.

The transistors 101 and 107 are smaller thin-gate devices and the inverters 103 and 104 are implemented with thin-gate devices. Thin-gate devices are relatively fast but unable to withstand higher voltage levels, such as greater than 1.5 Volts (V). The voltage difference or range of VDDL and GNDL is sufficiently large to enable switching of the devices and yet sufficiently small to protect each thin-gate device of the circuit 102 from being exposed to excessive voltage levels. The transistors 113, 115, 117 and 119 of the protection layer 104 are also thin-gate devices. The transistors 113 and 115 receive VDDL at their gates thereby preventing the voltage of the lower circuit 102 from exceeding VDDL. The transistors 117 and 119 receive GNDH at their gates thereby preventing the voltage of the upper circuit 106 from falling below GNDH. Likewise, the upper circuit 106 is implemented with thin-gate devices and the voltage range of VDDH and GNDH is sufficiently large to enable switching of the thin-gate devices and yet sufficiently small to protect each thin-gate device from being exposed to excessive voltage levels. Yet VDDH is greater than VDDL and GNDH is greater than GNDL (for the up-shift configuration), so that the effective switching voltage level of the up-shift circuit 100 is shifted to a higher level. The voltage level across the entire up-shift circuit 100, or VDDH to GNDL, can exceed the allowable maximum voltage of any given thin-gate device since none of the devices are exposed to the entire voltage range. And although GNDH may have a smaller magnitude than VDDL, GNDH can be the same voltage as VDDL or even a little higher to maximize the voltage differential between VDDH and GNDL. In this manner, the overall switching is relatively fast since smaller thin-gate devices are used and yet the voltage range is extended by operation of the protection layer 104 separating the lower and upper circuits 102 and 106.

The pair of circuits 102 and 106, each including complementary switched nodes, significantly improves noise immunity as compared to conventional level shift circuits. The complementary switching of the lower nodes 105 and 111 of the lower circuit 102 between opposite voltage levels within the limits of the lower voltage range VDDL/GNDL results in a push/pull function of the corresponding nodes 121 and 123 of the upper circuit 106. And the cross-coupled inverter configuration of the circuit 106 facilitates relatively fast and reliable switching action between the limits of the upper voltage range VDDH/GNDH in response to the complementary switching of the nodes 121 and 123. Any noise in the system tends to cancel or is otherwise compensated by the complementary switching action to ensure dependable switching action regardless of environment changes, temperature variations, or process anomalies and variations.

The transistors 113 and 115 of the protection layer 104 collectively operate to prevent the voltage level of the lower circuit 102 from exceeding VDDL whereas the transistors 117 and 119 collectively operate to prevent the voltage level of the upper circuit 106 from dropping below GNDH. The transistors 113 and 117 form a first isolation path between nodes 105 and 121 and the transistors 115 and 119 form a second isolation path between nodes 111 and 123. Each isolation path enables each of the nodes 105 and 111 to operate in a push/pull configuration to pull one of the nodes 121 and 123 towards GNDH and to push the other node higher. The cross-coupled inverters 125 and 127 operate as a latch that switches state in response to the changing states of the nodes 121 and 123.

Figure 2:
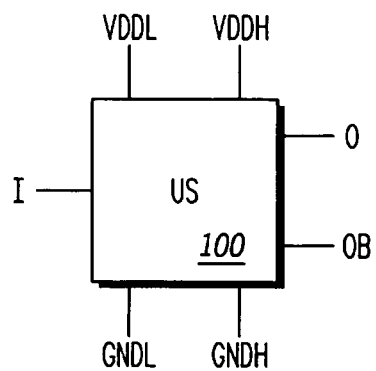
FIG. 2 is a block diagram representation of the up-shift circuit of FIG. 1.

FIG. 2 is a block diagram representation of the up-shift circuit 100. The input signal I is on the left side, the non-inverted output signal O is on the upper right side and the inverted output signal OB is on the lower right side. The lower voltage supply VDDL is top left and the upper voltage supply VDDH is top right. The lower voltage supply GNDL is bottom left and the upper voltage supply GNDH is bottom right. Thus, the input signal I at left switches between VDDL and GNDL while the output signals O and OB at right switch between VDDH and GNDH.

Figure 3:
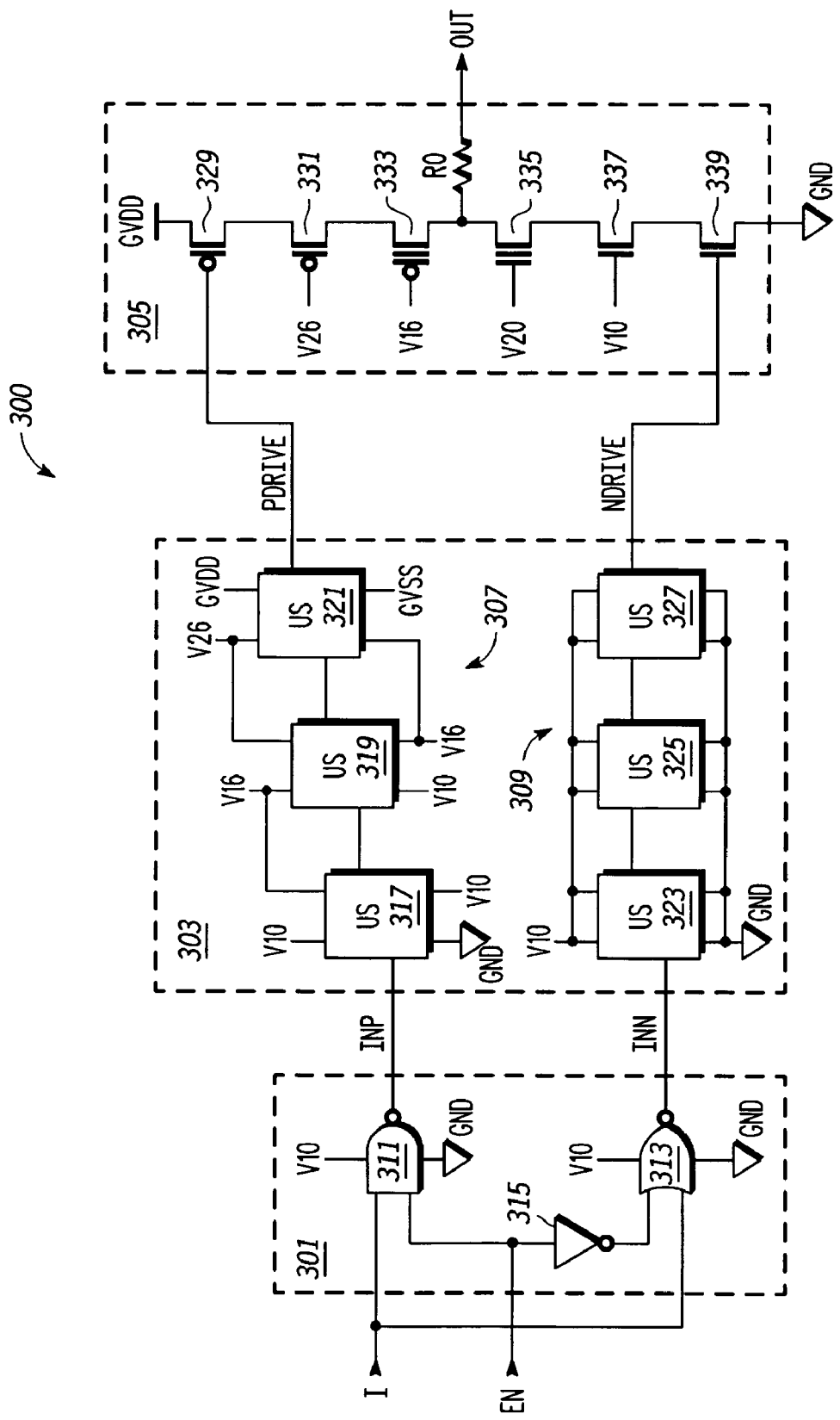
FIG. 3 is a schematic and block diagram of an output buffer implemented according to an embodiment of the present invention employing the up-shift circuit of FIG. 1 coupled in a cascade configuration.

FIG. 3 is a schematic and block diagram of an output buffer 300 implemented according to an embodiment of the present invention employing the up-shift circuit 100 coupled in a cascade configuration. The input signal I is provided to an input stage 301 operating within a lower voltage range between a reference voltage V10 and a common ground (GND). As described below, V10 is either a fixed reference voltage (e.g., 1 V) or is a scalable voltage level relative to GVDD. In an alternative embodiment, the input stage 301 may instead be referenced to a lower voltage supply terminal, such as "LVDD" or the like. The I signal and another enable signal EN operate in the voltage range V10 and GND. The input stage 301 provides a first or "P" path input signal INP and a second or "N" path input signal INN, which collectively represent the logic level of the input signal I (as further described below) and in which both switch within the lower voltage range of V10 and GND. The INP and INN signals are provided to respective inputs of an input/output (I/O) pre-driver 303, which includes a first or P path 307 generating a P path drive signal PDRIVE and an N path 309 generating an N path drive signal NDRIVE. The PDRIVE and NDRIVE signals are provided to respective inputs of an output stage 305, which operates in a relatively high voltage range between GVDD and GND signals and which develops an output signal OUT that switches within the higher voltage range of GVDD and GND. The P path 307 operates to level shift the P path logic signal from INP operative at V10/GND to PDRIVE operative between GVDD and another supply voltage GVSS. In the embodiment illustrated, the N path 309 does not appreciable shift the voltage level of INN relative to NDRIVE but is implemented with symmetrical components to match the timing of the P path 307 so that the PDRIVE and NDRIVE signals switch approximately at the same time.

For the input stage 301, the I signal is provided to one input of a two-input NAND gate 311 and to one input of a two-input NOR gate 313, both coupled between V10 and GND. The enable signal EN is provided to the other input of the NAND gate 311 and to the input of an inverter 315, having its output coupled to the other input of the NOR gate 313. The output of the NAND gate 311 provides the INP signal and the output of the NOR gate 313 provides the INN signal. In operation, when the EN signal is "negated" low to disable the output buffer 300, the INP signal remains high or logic one and the INN signal remains low or a logic zero. This collective logic state effectively tri-states the output stage 305 as further described below. When the EN signal is "asserted" high, the output buffer 300 is enabled and the NAND gate 311 and the NOR gate 313 are responsive to the input signal I to drive the states of the INP and INN signals. When enabled and when I is low, the INP and INN signals are both asserted high which drives the output signal OUT low. When enabled and when I is high, the INP and INN signals are both asserted low which drives the OUT signal high.

The P path 307 of the I/O pre-driver 303 includes multiple up-shift circuits 100 cascaded together. In particular, the INP signal is provided to the input of a first up-shift circuit 317, having its non-inverted output coupled to the input of a second up-shift circuit 319, having its non-inverted output coupled to the input of a third up-shift circuit 321, which provides the PDRIVE signal at its output. The inverted outputs of the up-shift circuits 317, 319 and 321 are not shown. The up-shift circuits 317, 319 and 321 are each configured in substantially identical manner as the up-shift circuit 100, except that the reference voltage levels for each are different to effectuate a cascaded up-shift in voltage level from INP to PDRIVE. For the up-shift circuit 317, the "GNDL" input is coupled to GND, the "GNDH" input is coupled to the voltage V10, the "VDDL" input is coupled to the V10 voltage, and the "VDDH" input is coupled to another reference voltage V16. In this manner, the up-shift circuit 317 is operative to shift the voltage level of INP from V10/GND to V16/V10. For the up-shift circuit 319, the GNDL input is coupled to V10, the GNDH input is coupled to the voltage V16, the VDDL input is coupled to the V16 voltage, and the VDDH input is coupled to a reference voltage V26. In this manner, the up-shift circuit 319 is operative to shift the voltage level from V16/V10 to V26/V16. For the up-shift circuit 321, the GNDL input is coupled to V16, the GNDH input is coupled to GVSS, the VDDL input is coupled to the V26 voltage, and the VDDH input is coupled to GVDD. In this manner, the up-shift circuit 319 is operative to shift the voltage level from V26/V16 to GVDD/GVSS. In one embodiment, GVSS is the same or substantially close to V26.

In various embodiments, the actual voltage levels of the voltages V10, V16, V26, GVSS and GVDD are either fixed at predetermined levels or are programmable and scalable relative to each other. In one embodiment, for GVDD equal to 3.3V relative to GND of 0V, the voltages V10, V16, V26 and GVSS are 1V, 1.6V, 2.6V and 2.6V, respectively. In another embodiment, these reference voltages are programmed and scaled based on the operating voltage level of GVDD, so that each scales up or down relative to GVDD. In an exemplary case in which GVDD is 3.3V relative to a GND voltage level of 0V, the up-shift circuits 317, 319 and 321 are implemented with thin-gate devices where the scaled voltage levels are configured to maintain the maximum voltage difference across each up-shift circuit within a predetermined maximum voltage range suitable for a single thin-gate device. This means that each thin-gate device is not exposed to higher voltage levels which would otherwise cause damage. Thus, each thin-gate device is isolated from the larger voltage ranges, such as from V16 to GND, from V26 to V10 or GND, or from GVDD to V16, V10 or GND. And even though each of the up-shift circuits 317, 319 and 321 comprise thin-gate devices, the cascaded configuration of the up-shift circuits enable the PDRIVE signal to be switched at a significantly a higher voltage level, such as 3.3V, without endangering any of the thin-gate devices. The use of thin-gate devices provides a speed advantage over higher voltage thick-gate devices.

The N path 309 of the I/O pre-driver 303 also includes multiple up-shift circuits 100 cascaded together in a similar manner as the P path 307. In particular, the INN signal is provided to the input of a first up-shift circuit 323, having its non-inverted output coupled to the input of a second up-shift circuit 325, having its non-inverted output coupled to the input of a third up-shift circuit 327, which provides the NDRIVE signal at its output. The inverted outputs of the up-shift circuits 323, 325 and 327 are not shown. The up-shift circuits 323, 325 and 327 are each configured in substantially identical manner as the up-shift circuit 100, but the input reference voltages are configured to maintain the same voltage level. In this case, the GNDL and GNDH inputs for each of the up-shift circuits 323, 325 and 327 are coupled to GND, and the VDDL and VDDH inputs are each coupled to V10. Thus, the N path 309 does not appreciably level shift the voltage between the NDRIVE and INN signals, but substantially maintains the same voltage level. Yet since the same number of up-shift circuits are inserted between the NDRIVE and INN signals as between the PDRIVE and INP signals, the delay of the N path 309 is substantially the same as the delay of the P path 307.

For the output stage 305, a P-channel transistor 329 has its source coupled to GVDD, its gate receiving the PDRIVE signal and its drain coupled to the source of another P-channel transistor 331. The gate of transistor 331 receives the V26 voltage and its drain is coupled to the source of another P-channel transistor 333. The gate of transistor 333 receives the V16 voltage and its drain is coupled to one end of an output resistor RO and to the drain of an N-channel transistor 335. The gate of transistor 335 receives a reference voltage V20 and its source is coupled to the drain of another N-channel transistor 337. The gate of transistor 337 receives the voltage V10 and its source is coupled to the drain of another N-channel transistor 339. The gate of transistor 339 receives the NDRIVE signal and its source is coupled to GND. The other end of the resistor RO provides the OUT signal. The voltage V20 may also be fixed or scalable in a similar manner as the other voltages V10, V16 and V26, and has a voltage level between the V16 and V26 voltages. In one embodiment in which GVDD is approximately 3.3V, V20 is approximately 2V. The transistors 329, 331, 337 and 339 are thin-gate devices whereas the transistors 333 and 335 are thick-gate devices. The thick gate devices are shown with an extra gate line symbolizing a thick gate device.

In operation of the output stage 305, the transistors 331, 333, 335 and 337 are coupled in a stacked configuration with the outer transistors 329 and 339. The OUT signal is pulled high when the PDRIVE and NDRIVE signals are both low and the OUT signal is pulled low when the PDRIVE and NDRIVE signals are both high. When the EN signal is low, the INP and PDRIVE signals are high and the INN and NDRIVE signals are low thereby tri-stating the OUT signal. When OUT is asserted low, the transistor 333 is exposed to a larger voltage range between V16 and GND and is thus a larger voltage device. The transistor 329, however, is exposed only to the voltage difference between GVDD and V26 and the transistor 331 is exposed only to the voltage difference between V26 and V16. When OUT is asserted high, the transistor 335 is exposed to a larger voltage range between GVDD and V20 and is thus a larger voltage device. The transistor 339, however, is exposed only to the voltage difference between V10 and GND and the transistor 337 is exposed only to the voltage difference between V20 and V10. Thus, the thin-gate devices are exposed only to a relatively safe voltage level, e.g., 1V. Also, the OUT signal is switched by switching action of the fast thin-gate devices 329 and 339 and the thick-gate transistors 333 and 335 essentially remain on and do not switch. The thick-gate devices 333 and 335 are inserted in the output switching path to prevent the thin-gate devices from excessive voltage levels, but do not switch and thus do not appreciably slow down the switching path.

The output buffer 300 illustrates the up-shift circuit 100 in a cascade configuration in which multiple up-shift circuits are coupled in a series to shift the voltage from a lower voltage to a higher voltage. Each up-shift circuit shifts the voltage by an incremental amount, such as by 1V, until the final upper voltage level is achieved. Each up-shift circuit is effectively isolated from the other circuits so that the thin-gate devices remain isolated from excessive voltage levels. Although only three stages are shown for the output buffer 300, it is understood that any practicable number (two or more) may be cascaded together to shift from one voltage level to another. Additional up-shift circuits may be employed, for example, to increase the voltage of 5V or more. And since each up-shift circuit is implemented with thin-gate devices, shifting from one circuit to the next is relatively fast as compared to conventional level shifter topologies employing larger and higher voltage devices. The larger and higher voltage devices are employed in the output stage to enable the full voltage swing of the output signal while providing protection for the smaller and lower voltage devices without significantly compromising switching speed.

Figure 4:
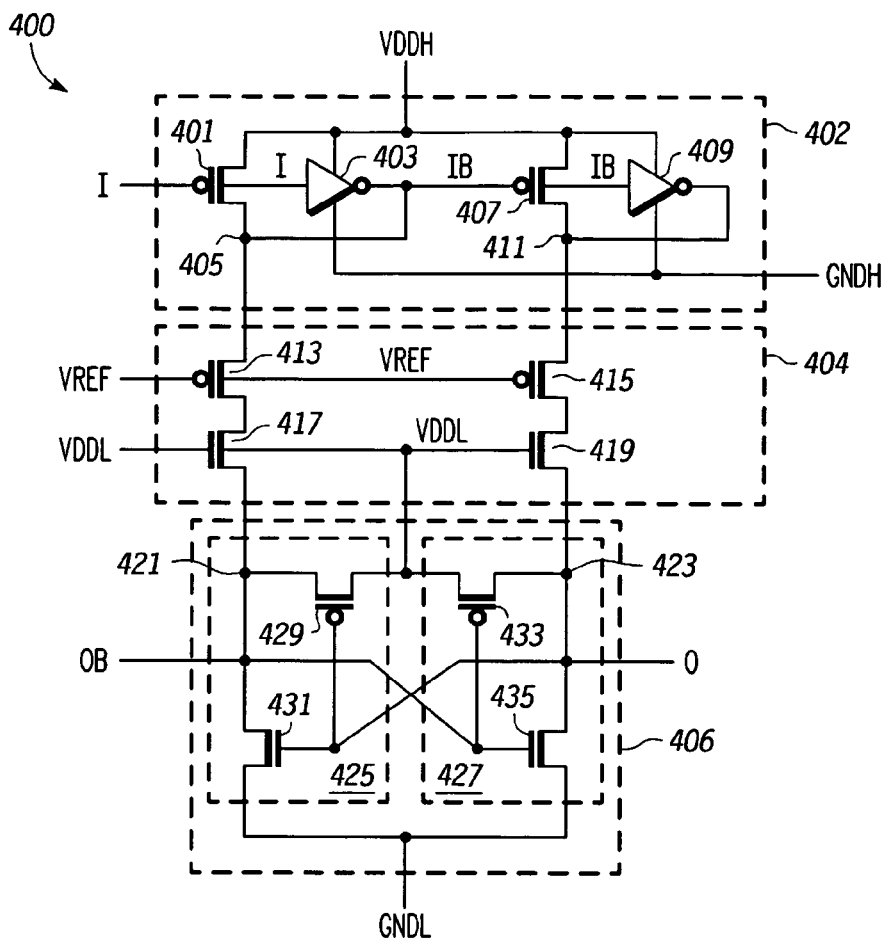
FIG. 4 is a schematic diagram of a down-shift circuit implemented according to an exemplary embodiment of the present invention.

FIG. 4 is a schematic diagram of a down-shift circuit 400 implemented according to an exemplary embodiment of the present invention. The down-shift circuit 400 is an inverted and complementary version of the up-shift circuit 100. In particular, the down-shift circuit 400 includes an upper input circuit 402 which is similar to the lower input circuit 102 except positioned at the top of the circuit and including P-channel devices in place of N-channel devices. The down-shift circuit 400 also includes a lower output circuit 406, which is similar to the upper output circuit 106 except positioned at the bottom of the circuit and in which the P-channel transistors are replaced with N-channel transistors and vice-versa. A protection layer 404 is interposed between the circuits 402 and 406 and configured in substantially the same manner as the protection layer 104. An input signal I is provided to the gate of a P-channel transistor 401 and to the input of an inverter 403 within the circuit 402. The inverter 403 has input power terminals coupled between the pair of upper voltage supplies VDDH and GNDH. The inverter 403 has an output coupled to a node 405 developing an inverted input signal IB, which is further coupled to the drain of transistor 401, to the gate of a P-channel transistor 407, and to the input of another inverter 409. The inverter 409 has input power terminals coupled between the voltage supply references VDDH and GNDH and the sources of the transistors 401 and 407 are coupled to VDDH. The output of inverter 409 is coupled to a node 411, which is further coupled to the drain of transistor 407.

The protection layer 404 includes a P-channel transistor 413 having a source coupled to node 405 and another P-channel transistor 415 having a source coupled to node 411. A reference voltage VREF is provided to the gates of transistors 413 and 415. It is noted that the voltage levels of GNDH and VREF may be the same or relatively close to each other and may in fact be the same node in an alternative embodiment. The drain of transistor 413 is coupled to the drain of an N-channel transistor 417 and the drain of transistor 415 is coupled to the drain of another N-channel transistor 419. VDDL is provided to the gates of transistors 417 and 419. The source of transistor 417 is coupled to a node 421 and the source of transistor 419 is coupled to another node 423. The nodes 421 and 423 are coupled to the circuit 406, which switches between the lower voltage supply levels VDDL and GNDL. Again, the supplies GNDL and GNDH are reference voltage levels relative to VDDH and VDDL, respectively, and are "ground" signals in name only unless actually coupled to a circuit or chassis ground plane.

The circuit 406 includes a pair of cross-coupled inverters 425 and 427. The inverter 425 includes a P-channel transistor 429 and an N-channel resistor 431, each having drains coupled together forming an output of the inverter 425, which output is coupled to node 421. The gates of the transistors 429 and 431 are coupled together forming an input of the inverter 425, which input is coupled to node 423. The inverter 427 includes a P-channel transistor 433 and an N-channel resistor 435, each having drains coupled together forming an output of the inverter 427, which output is coupled to node 423. The gates of the transistors 433 and 435 are coupled together forming an input of the inverter 427, which input is coupled to node 421. The sources of transistors 429 and 433 are coupled together at VDDL and the sources of transistors 431 and 435 are coupled together at GNDL. The node 423 is a non-inverted output of the down-shift circuit 400 developing an output signal O, and the node 421 is an inverted output of the down-shift circuit 400 developing an inverted output signal OB.

In operation of the down-shift circuit 400, the input signal I switches between voltage levels VDDH and GNDH or relatively close thereto. Assuming I is initially low or logic "zero" and asserted at our near GNDH, the transistor 401 is turned on and the inverter 403 pulls node 405 high to VDDH. The transistor 407 is off and the inverter 409 pulls the node 411 low to GNDH. Thus, when I is low, node 405 is high and node 411 is low. Node 405 pulled high to VDDH pulls node 421 high towards VDDL via transistors 413 and 417 of the protection layer 404. Yet the transistor 417 receiving VDDL at its gate prevents node 421 from going higher than VDDL. Node 421 pulled high turns on transistor 435 and turns off transistor 433, which pulls node 423 low. Also, node 411 pulled low tends to push node 423 to a lower voltage level via transistors 415 and 419. When node 423 is low, transistor 429 is turned on and transistor 431 is turned off allowing node 421 to go high. In this manner, when I is low, node 421 is high at VDDL and node 423 is low at GNDL, so that the output signal O is at GNDL. When I goes high to VDDH, the transistor 401 is turned off and the output of the inverter 403 goes low pulling node 405 low to GNDH. Transistor 407 is turned on and the output of the inverter 409 goes high driving node 411 high to VDDH. Node 405 going low tends to push node 421 low via transistors 413 and 417.

Node 411 going high pulls node 423 higher via the protection layer 404, which begins turning transistor 431 on and transistor 429 off. The dual action of pulling node 423 high and pushing node 421 low causes the inverter 425 to switch to pull node 421 low to GNDL. This in turn causes the inverter 427 to pull the node 423 high to VDDL, so that the output signal O goes high to VDDL.

In sum, the upper input circuit 402 is responsive to the input signal I to switch nodes 405 and 411 to opposite states within the upper voltage range VDDH and GNDH, and the nodes 421 and 423 of the lower output circuit 406 are responsive to nodes 405 and 411, respectively, causing them to switch to opposite states within the lower voltage range VDDL and GNDL. The node 423 is the non-inverted output node providing the output signal O, which is driven to the equivalent logic state as the input signal I yet shifted from VDDH/GNDH to VDDL/GNDL. The node 421 is the inverted output node providing the inverted output signal OB, which is driven to the opposite state as the input signal I yet shifted from GNDH/VDDH to GNDL/VDDL. In a similar manner as described above for the up-shift circuit 100, the down-shift circuit 400 is implemented entirely with smaller, lower voltage thin-gate devices. The voltage level across the entire down-shift circuit 400, or VDDH to GNDL, can exceed the allowable maximum voltage of a thin-gate device since none of the individual devices are exposed to the entire voltage range. And although GNDH and/or VREF may have a smaller magnitude than VDDL, GNDH can be the same voltage as VDDL or even a little higher to maximize the voltage differential between VDDH and GNDL. In this manner, the overall switching is very fast since using smaller thin-gate devices and yet the voltage range is extended by operation of the protection layer 404 separating the lower and upper circuits 406 and 402.

The down-shift circuit 400 exhibits similar features of the up-shift circuit 100. The complementary switching of the upper nodes 405 and 411 of the circuit 402 between opposite voltage levels within the limits of the upper voltage range VDDH/GNDH results in a push/pull function of the corresponding nodes 421 and 423 of the circuit 406. And the cross-coupled inverter configuration of the circuit 406 facilitates relatively fast and reliable switching action between the limits of the lower voltage range VDDL/GNDL in response to the complementary switching of the nodes 421 and 423. The protection layer 404 prevents the voltage of the circuit 402 from falling below VREF and prevents the voltage of the circuit 406 from exceeding VDDL. Any noise in the system tends to cancel or is otherwise compensated by the complementary switching action to ensure dependable switching action regardless of environment changes, temperature variations, or process anomalies and variations.

The transistors 413 and 415 of the protection layer 404 collectively operate to prevent the voltage level of the circuit 402 from falling below VREF whereas the transistors 417 and 419 collectively operate to prevent the voltage level of the circuit 406 from exceeding VDDL. The transistors 413 and 417 form a first isolation path between nodes 405 and 421 and the transistors 415 and 419 form a second isolation path between nodes 411 and 423. Each isolation path enables each of the nodes 405 and 411 to operate in a push/pull configuration to pull one of the nodes 421 and 423 higher towards VDDL and to push the other node lower. The cross-coupled inverters 425 and 427 operate as a latch that switches state in response to the changing states of the nodes 421 and 423.

Figure 5:
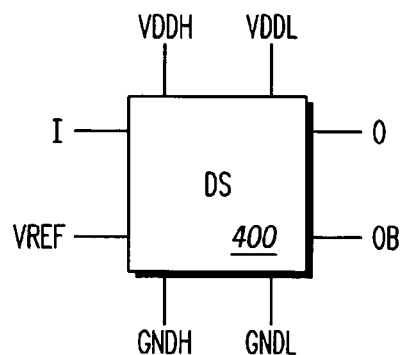
FIG. 5 is a block diagram representation of the down-shift circuit of FIG. 4.

FIG. 5 is a block diagram representation of the down-shift circuit 400. The input signal I is on the upper left side while the VREF input is on the lower left side. The non-inverted output signal O is on the upper right side whereas the inverted output signal OB is on the lower right side. The upper voltage supply VDDH is top left and the lower voltage supply VDDL is top right. The upper voltage supply GNDH is bottom left and the lower voltage supply GNDL is bottom right. Thus, the input signal I at left switches between VDDH and GNDH while the output signal O at right switches between VDDL and GNDL.

Figure 6:
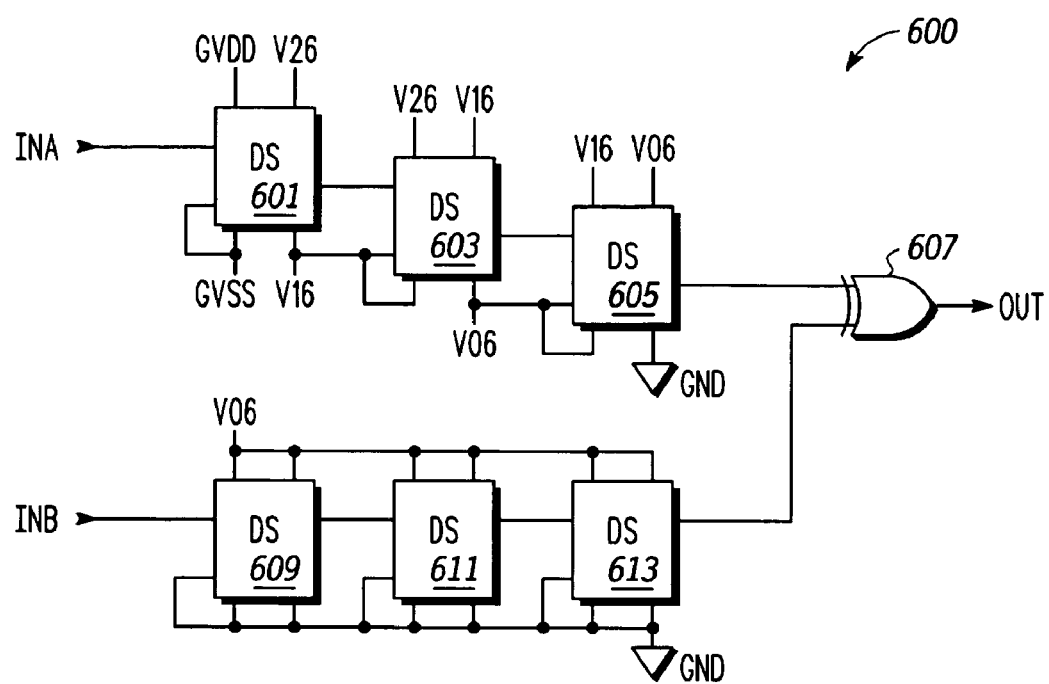
FIG. 6 is a schematic diagram of a logic circuit employing the down-shift circuit of FIG. 4 coupled in a cascaded configuration.

FIG. 6 is a schematic diagram of a logic circuit 600 for comparing two signals INA and INB using a two-input exclusive OR (XOR) gate 607 employing the down-shift circuit 400 coupled in a cascaded configuration for generating an output signal OUT. The INA signal switches between GVDD and GVSS whereas the INB signal switches between a lower voltage signal V06 and GND. The INA signal is downshifted to the voltage level of the INB signal. In the embodiment illustrated, GVDD is 3.3V, GVSS is 2.6V, and V06 is 0.6V. The voltage signals V26 and V16 are 2.6V and 1.6V, respectively. The INA signal is provided to the input of a first down-shift circuit 601, which has its non-inverted output coupled to the input of a second down-shift circuit 603, which has its non-inverted output coupled to the input of a third down-shift circuit 605, which has its non-inverted output coupled to one input of the XOR gate 607. The inverted outputs of the down-shift circuits 601, 603 and 605 are not used and are not shown. The VDDH, VDDL, VREF, GNDH and GNDL inputs of the down-shift circuit 601 receive the GVDD, V26, GVSS, GVSS and V16 signals, respectively. The VDDH, VDDL, VREF, GNDH and GNDL inputs of the down-shift circuit 603 receive the V26, V16, V16, V16 and V96 signals, respectively. The VDDH, VDDL, VREF, GNDH and GNDL inputs of the down-shift circuit 605 receive the V16, V06, V06, V06 and GND signals, respectively. In this manner, the INA signal is down-shifted from the voltage range GVDD/GVSS to the voltage range V06/GND.

The INB signal could be provided directly to the other input of the XOR gate 607. However, in the configuration illustrated it is desired to establish relatively equal timing between the INA and INB signals at the input of the XOR gate 607. Therefore, the INB signal is provided to the input of a first down-shift circuit 609, which has its non-inverted output coupled to the input of a second down-shift circuit 611, which has its non-inverted output coupled to the input of a third down-shift circuit 613, which has its non-inverted output coupled to the other input of the XOR gate 607. The inverted outputs of the down-shift circuits 609, 611 and 613 are not used and are not shown. The voltage V06 is provided to the VDDH and VDDL inputs of each of the down-shift circuits 609, 611 and 613 and the GND signal is provided to the VREF, GNDH and GNDL inputs of the down-shift circuits 609, 611 and 613. In this manner, the INB signal is not level shifted but is delayed by approximately the same amount as the INA signal to the inputs of the XOR gate 607.

Figure 7:
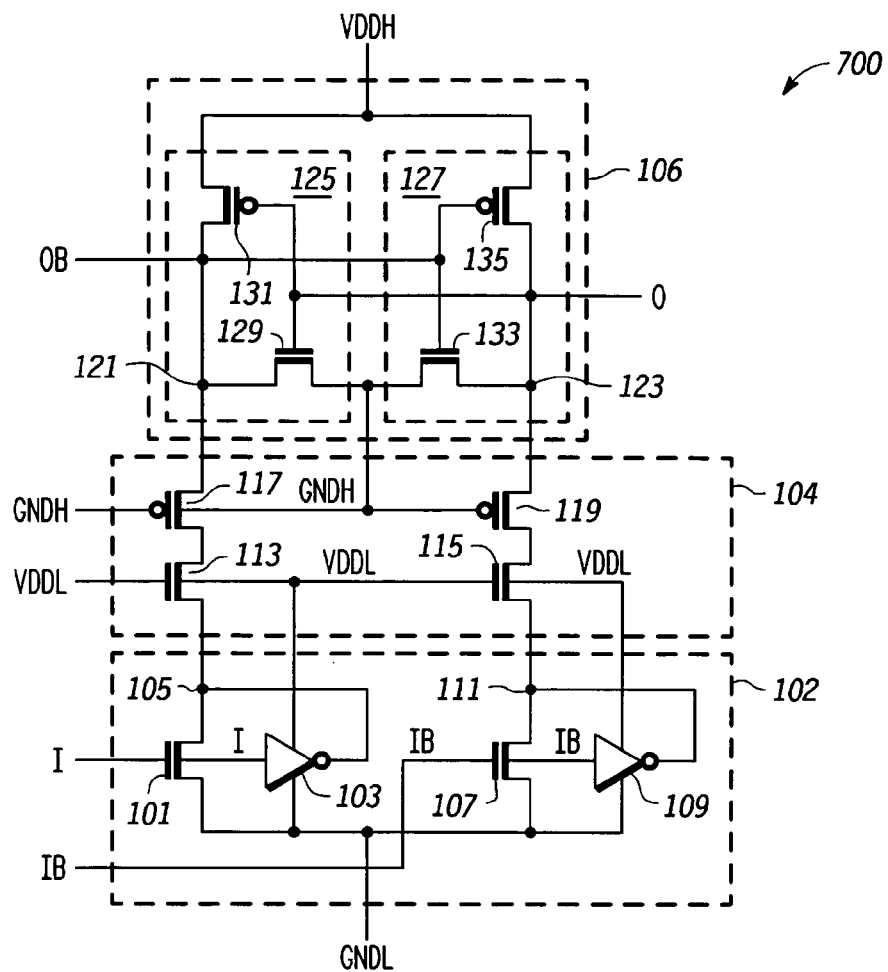
FIG. 7 is a schematic diagram of a complementary up-shift circuit implemented according to an exemplary embodiment of the present invention which receives non-inverted and inverted input signals.

FIG. 7 is a schematic diagram of a complementary up-shift circuit 700 implemented according to an exemplary embodiment of the present invention. The up-shift circuit 700 is substantially similar to the up-shift circuit 100, except that the output of the internal inverter 103 is not coupled to the gate of the transistor 107 or the input of the inverter 109. Instead, an external IB signal is provided to the gate of the transistor 107 and to the input of the inverter 109. Of course, the output of the inverter 103, which is still provided to drive the node 105, is an inverted version of the input signal I. In this case, however, a separate inverted input signal IB from an external source is provided. As illustrated below, the inverted input signal IB may be sourced from the inverted output of a previous up-shift circuit resulting in a more symmetrical and balanced circuit configuration.

Figure 8:
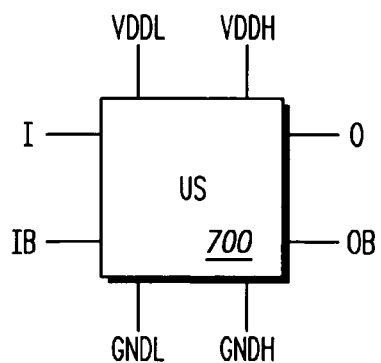
FIG. 8 is a block diagram representation of the complementary up-shift circuit of FIG. 7.

FIG. 8 is a block diagram representation of the complementary up-shift circuit 700. The non-inverted input signal I is received at the upper left side and the inverted input signal IB is received at the lower left side. As before, the non-inverted output signal O is on the upper right side, the inverted output signal OB is on the lower right side, the lower voltage supply VDDL is top left, the upper voltage supply VDDH is top right, the lower voltage supply GNDL is bottom left and the upper voltage supply GNDH is bottom right. The input signals I and IB at left switch between VDDL and GNDL and the output signals O and OB at right switch between VDDH and GNDH.

Figure 9:
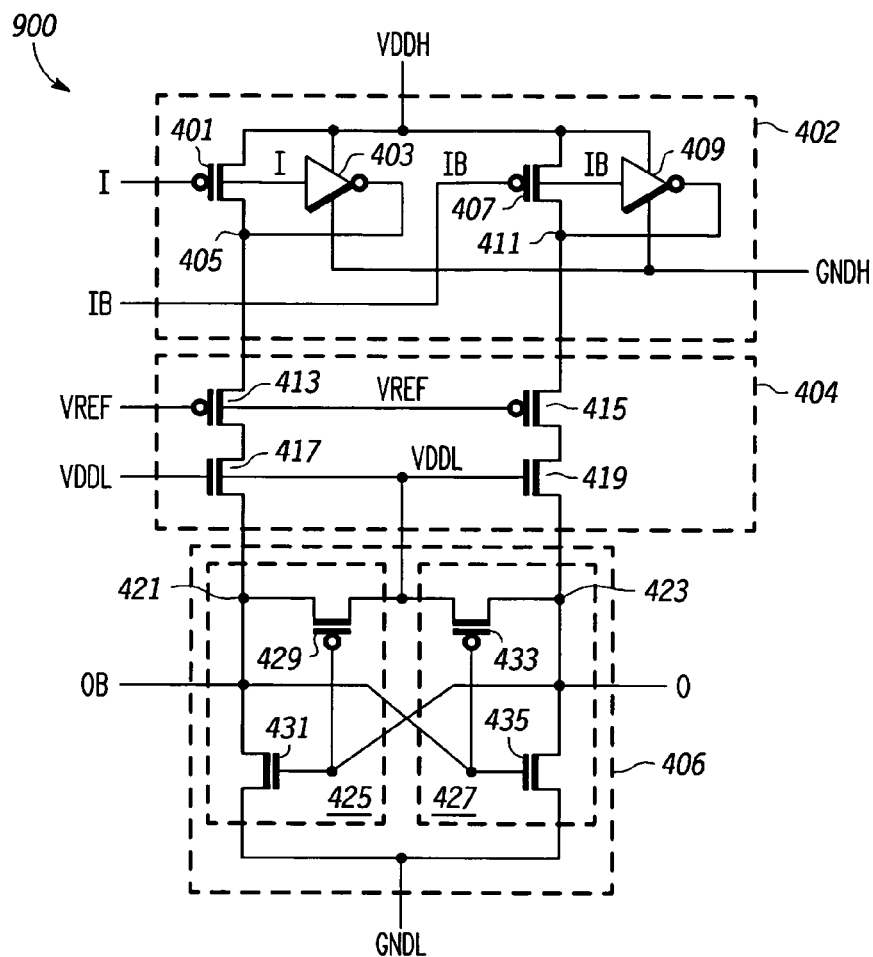
FIG. 9 is a schematic diagram of a complementary down-shift circuit implemented according to an exemplary embodiment of the present invention which receives non-inverted and inverted input signals.

FIG. 9 is a schematic diagram of a complementary down-shift circuit 900 implemented according to an exemplary embodiment of the present invention. The down-shift circuit 900 is substantially similar to the down-shift circuit 400, except that the output of the internal inverter 403 is not coupled to the gate of the transistor 407 or the input of the inverter 409. Instead, an external IB signal is provided to the gate of the transistor 407 and to the input of the inverter 409. Of course, the output of the inverter 403, which is still provided to drive the node 405, is an inverted version of the input signal I. In this case, however, a separate inverted input signal IB from an external source is provided. The inverted input signal IB may be sourced from the inverted output of a previous down-shift circuit resulting in a more symmetrical and balanced circuit configuration.

Figure 10:
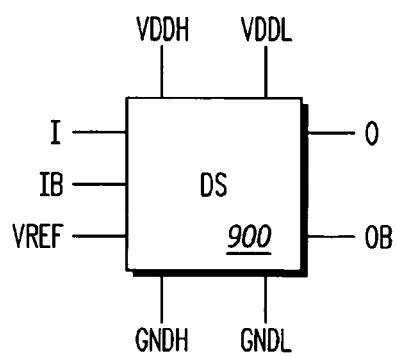
FIG. 10 is a block diagram representation of the complementary down-shift circuit of FIG. 9.

FIG. 10 is a block diagram representation of the complementary down-shift circuit 900. The non-inverted input signal I is received at the upper left side, the inverted input signal IB is received at the middle left side and VREF is received at the lower left side. As before, the non-inverted output signal O is on the upper right side, the inverted output signal OB is on the lower right side, the upper voltage supply VDDH is top left, the lower voltage supply VDDL is top right, the upper voltage supply GNDH is bottom left and the lower voltage supply GNDL is bottom right. The input signals I and IB at left switch between VDDL and GNDL and the output signals O and OB at right switch between VDDH and VREF (or GNDH).

Figure 11:
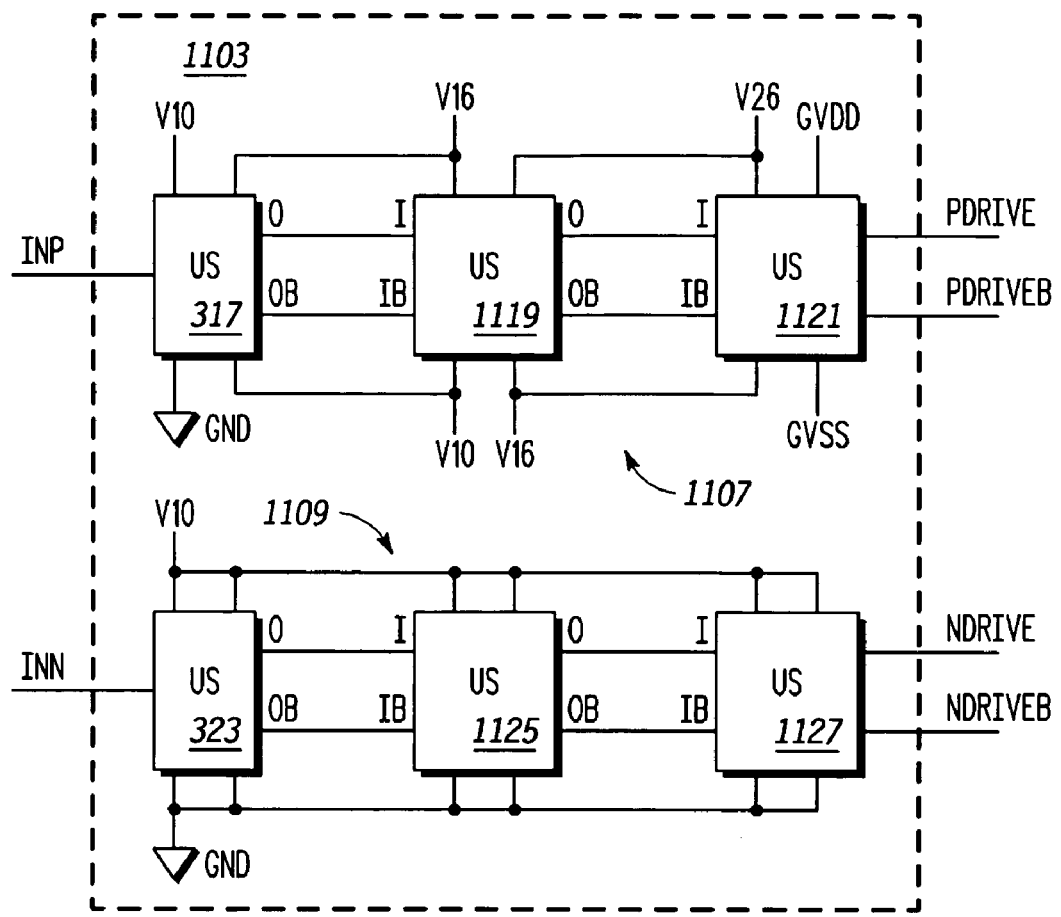
FIG. 11 is a schematic and block diagram of a complementary version of the I/O pre-driver of FIG. 3.

FIG. 11 is a schematic and block diagram of an I/O pre-driver 1103, which is a complementary embodiment of the I/O pre-driver 303. Logical operation is substantially identical. The I/O pre-driver 1103 includes a first or P path 1107 similar to the P path 307 for generating the P path drive signal PDRIVE, and includes an N path 1109 similar to the N path 309 for generating the N path drive signal NDRIVE. The NP signal is provided to the input of the up-shift circuit 317 in the same manner as for the I/O pre-driver 303. In this case, however, the non-inverted and inverted outputs O and OB are provided to the non-inverted and inverted inputs, respectively, of a second complementary up-shift circuit 1119. The complementary up-shift circuit 1119 is configured in the same manner as the complementary up-shift circuit 700. In this manner, the inverted input signal IB of the up-shift circuit 1119 is sourced from the inverted output OB of the first up-shift circuit 317 in the cascaded configuration. And the non-inverted and inverted outputs O and OB of the up-shift circuit 1119 are coupled to the non-inverted and inverted inputs of a complementary up-shift circuit 1121 in similar manner. The non-inverted and inverted outputs of the up-shift circuit 1121 provide the PDRIVE signal and an inverted PDRIVE signal PDRIVEB, respectively. The VDDL, GNDL, VDDH and GNDH inputs of the up-shift circuits 317, 1119 and 1121 of the I/O pre-driver 1103 are the same as the corresponding up-shift circuits of the I/O pre-driver 303.

The N path 1109 is modified for the complementary configuration in a similar manner. Here, the INN signal is provided to the input of the up-shift circuit 323, which has its non-inverted and inverted outputs O and OB coupled to the non-inverted and inverted inputs of a complementary up-shift circuit 1125, respectively. And the non-inverted and inverted outputs O and OB of the up-shift circuit 1125 are coupled to the non-inverted and inverted inputs of another complementary up-shift circuit 1127, respectively. The non-inverted and inverted outputs of the up-shift circuit 1127 provide the NDRIVE signal and an inverted NDRIVE signal NDRIVEB, respectively.

In a cascaded configuration, the complementary outputs of one shift circuit (up or down) are coupled to the corresponding complementary inputs of the next shift circuit and so on. The complementary embodiment provides a more symmetrical and balanced circuit cascaded configuration. In particular, for the I/O pre-driver 303, note that only the non-inverted output of up-shift circuit 317 is coupled to a load, which is the input of the up-shift circuit 319 as shown in FIG. 3. The inverted output node of the up-shift circuit 317 is not connected, resulting in a load imbalance between the inverted and non-inverted outputs. On the other hand, for the I/O pre-driver 1103, both the non-inverted and inverted outputs of the up-shift circuit 317 are coupled to a load, which includes the non-inverted and inverted inputs of the next up-shift circuit 1119 in the cascaded configuration of FIG. 11. And this is repeated in the same manner from one up-shift circuit to the next. In this manner, both outputs are loaded by about the same amount providing a more balanced and symmetrical configuration.

A level shifter circuit according to an embodiment of the present invention includes first and second circuits and a protection layer. The first circuit is responsive to an input signal and switches first and second nodes to opposite states within a first voltage range between first and second supply voltages. The second circuit switches the third and fourth nodes to opposite states within a second voltage range between third and fourth supply voltages in response to switching of the first and second nodes. The protection layer couples the first and second nodes to third and fourth nodes via first and second isolation paths, respectively. The isolation paths operate to keep the first and second nodes within the first voltage range and to keep the third and fourth nodes within the second voltage range.

The first and second circuits and the protection layer may be made entirely of thin-gate oxide devices which are suitable for either of the first and second voltage ranges but which are not suitable to a full voltage range between the first and fourth supply voltages. Thin gate-oxide devices are not capable of withstanding higher voltage levels but switch faster than higher voltage devices. The protection layer enables the overall voltage level to exceed the maximum voltage allowed for any given thin gate-oxide device, thereby allowing the overall voltage switching range to be increased without exposing the thin gate-oxide devices to excessive voltage levels since isolated within the respective first and second circuits.

In one embodiment, the level shift circuit is an up-shift circuit in which the first circuit includes first and second N-channel devices and first and second inverters. The first N-channel device has a gate receiving the input signal, a source coupled to the first supply voltage and a drain coupled to the first node. The first inverter has an input receiving the input signal, an output coupled to the first node, and supply inputs coupled between the first and second supply voltages. The second N-channel device has a gate coupled to the output of the first inverter, a source coupled to the first supply voltage and a drain coupled to the second node. The second inverter has an input coupled to the output of the first inverter, an output coupled to the second node, and supply inputs coupled between the first and second supply voltages.

In an alternative complementary embodiment of the up-shift circuit, the gate of the first N-channel device and the input of the first inverter receive a non-inverted input signal and the gate of the second N-channel device and the input of the second inverter receive an inverted input signal. The third and fourth nodes of the second circuit provide complementary outputs including a non-inverted output and an inverted output. In this manner, multiple up-shift circuits may be daisy-chained or cascaded together in which the complementary outputs of one up-shift circuit couples to the complementary inputs of a next level shift circuit.

In a more specific up-shift circuit, the fourth supply voltage has a larger magnitude than the second supply voltage and the third supply voltage has a larger magnitude than the first supply voltage. The second and third supply voltages may be relatively close or equal to each other to extend the overall voltage range of the level shift circuit.

In an alternative embodiment, the level shift circuit is a down-shift circuit in which the first circuit cell includes first and second P-channel devices and first and second inverters. The down-shift circuit is a complement or "inverted" version of the up-shift circuit in which the positions of the first and second circuits are reversed. The first P-channel device has a gate receiving the input signal, a source coupled to the first voltage supply and a drain coupled to the first node. The first inverter has an input receiving the input signal, an output coupled to the first node, and supply inputs coupled between the first and second supply voltages. The second P-channel device has a gate coupled to the output of the first inverter, a source coupled to the first supply voltage and a drain coupled to the second node. The second inverter has an input coupled to the output of the first inverter, an output coupled to the second node, and supply inputs coupled between the first and second supply voltages.

In an alternative complementary embodiment of the down-shift circuit, the gate of the first P-channel device and the input of the first inverter receive a non-inverted input signal and the gate of the second P-channel device and the input of the second inverter receive an inverted input signal. The third and fourth nodes of the second circuit provide complementary outputs including a non-inverted output and an inverted output. In this manner, multiple down-shift circuits may be daisy-chained or cascaded together in which the complementary outputs of one down-shift circuit couples to the complementary inputs of a next down-shift circuit.

In a more specific down-shift circuit, the first supply voltage has a larger magnitude than the third supply voltage and the second supply voltage has a larger magnitude than the fourth supply voltage. Again, the second and third supply voltages may be relatively close or equal to each other to extend the overall voltage range of the level shift circuit.

The isolation paths of the protection layer each include an N-channel device and a P-channel device coupled in series between corresponding nodes of the first and second circuits. The N-channel devices receive or are otherwise biased by a maximum voltage for the lower voltage circuit whereas the P-channel devices receive or are otherwise biased by a minimum voltage for the upper voltage circuit. The upper minimum voltage may be a separate reference voltage.

The second circuit for either the up- or down-shift circuit includes first and second cross-coupled inverters coupled between the third and fourth nodes. Each inverter may be implemented with an N-channel device and a P-channel device. The third and fourth nodes serve as inverted and non-inverted outputs, so that either or both outputs of the level shift circuit may be used.

A voltage shift circuit according to an embodiment of the present invention includes multiple voltage level shifter circuits coupled in cascade, where the cascade configuration includes a first level shifter circuit and a last level shifter circuit. The first level shifter circuit has an input receiving a first input signal switched between first and second voltages collectively having a first common mode voltage and having a first voltage difference that is within a predetermined maximum voltage difference. The last level shifter circuit has an output providing a first drive signal that is switched between third and fourth voltages collectively having a second common mode voltage and having a second voltage difference that is within the predetermined maximum voltage difference. The first common mode voltage is different from the second common mode voltage to achieve the shift in voltage level, where a full voltage difference across the first and fourth voltages is greater than the predetermined maximum voltage difference.

In one embodiment, each of the voltage level shifter circuits includes an input circuit, an isolation layer and an output circuit. The input circuit switches first and second nodes to opposite states within a first voltage range in response to an input signal. The isolation layer couples the first and second nodes to third and fourth nodes via first and second isolation paths, respectively. The output circuit includes cross-coupled inverters that switch the third and fourth nodes to opposite states within a second voltage range in response to switching of the first and second nodes. The first and second voltage ranges each have different common mode voltages and each have voltage differences that are within the predetermined maximum voltage difference.

In a complementary embodiment, at least one of the cascaded voltage level shifter circuits is a complementary voltage level shifter circuit including first and second inverters. The first inverter has an input receiving a non-inverted input signal and has an output which drives the first node of the complementary voltage level shifter circuit. The second inverter has an input receiving an inverted input signal and an output driving the second node of the complementary voltage level shifter circuit. The third and fourth nodes of the complementary voltage level shifter circuit collectively form a complementary output.

Each voltage level shifter circuit may be implemented with only thin gate-oxide devices in which a single thin gate-oxide device is suitable for the predetermined maximum voltage difference but is not suitable for the full voltage difference. In this manner, it is appreciated that each voltage level shifter circuit is able to incrementally extend the overall voltage range using lower voltage devices without exposing any single lower voltage device to an excessive voltage level. The voltage level shifter circuits may be either an up-shift circuit or a down-shift circuit. The second common mode voltage is greater than the first common mode voltage for the up-shift circuit and the first common mode voltage is greater than the second common mode voltage for the down-shift circuit.

The voltage shift circuit may further include an input circuit, a second set of voltage level shifter circuits coupled in cascade and an output circuit. The input circuit has an input receiving a digital signal and outputs providing the first input signal and a second input signal, where the first and second input signals collectively represent the digital signal. The second set of voltage level shifter circuits include a first level shifter circuit having an input receiving the second input signal switched within the predetermined maximum voltage difference, and includes a last level shifter circuit having an output providing a second drive signal that is switched within the predetermined maximum voltage difference. In this manner, the second set of voltage level shifter circuits provide a symmetrical configuration between the first and second input signals and the first and second drive signals, respectively. The output circuit includes first and second inputs receiving the first and second drive signals, respectively, and an output that switches an output node across the full voltage difference. In this manner, the voltage shift circuit operates to convert the digital signal operative within the predetermined maximum voltage difference to an output signal operative within a larger voltage range. In one embodiment, number of voltage level shifter circuits between the first and second cascaded sets is the same to minimize a timing difference between the first and second drive signals.

A method of voltage shifting a signal includes providing a first circuit that switches first and second nodes within a first voltage range to opposite states in response to an input signal, coupling the first node to a third node through a first isolation path which keeps the first node within the first voltage range and which keeps the third node within a second voltage range, coupling the second node to a fourth node through a second isolation path which keeps the second node within the first voltage range and which keeps the fourth node within the second voltage range, and providing a second circuit coupled to the third and fourth nodes which switches the third and fourth nodes to opposite states within the second voltage range in response to switching of the first and second nodes. The method may include providing a first inverter powered within the first voltage range that switches the first node to an opposite state of a non-inverted input signal, and providing a second inverter powered within the first voltage range that switches the second node to an opposite state of an inverted input signal. The method may include cross-coupling inverters between the third and fourth node and powering the inverters within the second voltage range.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A level shifter circuit, comprising:
  a first circuit, responsive to an input signal, that switches first and second nodes to opposite states within a first voltage range between first and second supply voltages;
  a protection layer which couples said first and second nodes to third and fourth nodes via first and second isolation paths, respectively, wherein said first and second isolation paths keep said first and second nodes within said first voltage range and keep said third and fourth nodes within a second voltage range; and
  a second circuit that switches said third and fourth nodes to opposite states within said second voltage range between third and fourth supply voltages in response to switching of said first and second nodes, said second circuit comprising:
- a first inverter having an input coupled to said fourth node, an output coupled to said third node and supply inputs coupled between said third and fourth supply voltages; and
- a second inverter having an input coupled to said third node, an output coupled to said fourth node and supply inputs coupled between said third and fourth supply voltages.

2. The level shifter circuit of claim 1, wherein said first and second circuits and said protection layer each comprise thin gate-oxide devices which are suitable for either of said first and second voltage ranges but which are not suitable to a full voltage range between said first and fourth supply voltages.

3. The level shifter circuit of claim 1, wherein said first circuit comprises:
- a first N-channel device having a gate receiving said input signal, a source coupled to said first supply voltage and a drain coupled to said first node;
- a first inverter having an input receiving said input signal, an output coupled to said first node, and supply inputs coupled between said first and second supply voltages;
- a second N-channel device having a gate coupled to said output of said first inverter, a source coupled to said first supply voltage and a drain coupled to said second node; and
- a second inverter having an input coupled to said output of said first inverter, an output coupled to said second node, and supply inputs coupled between said first and second supply voltages.

4. The level shifter circuit of claim 1, wherein said protection layer comprises:
- a first N-channel device having a gate receiving said second supply voltage, a source coupled to said first node and a drain;
- a first P-channel device having a gate receiving said third supply voltage, a source coupled to said third node and a drain coupled to said drain of said first N-channel device;
- a second N-channel device having a gate receiving said second supply voltage, a source coupled to said second node and a drain; and
- a second P-channel device having a gate receiving said third supply voltage, a source coupled to said fourth node and a drain coupled to said drain of said second N-channel device.

5. The level shifter circuit of claim 1, wherein said first circuit comprises:
- a first N-channel device having a gate receiving a non-inverted input signal, a source coupled to said first supply voltage and a drain coupled to said first node;
- a first inverter having an input receiving said non-inverted input signal, an output coupled to said first node, and supply inputs coupled between said first and second supply voltages;
- a second N-channel device having a gate receiving an inverted input signal, a source coupled to said first supply voltage and a drain coupled to said second node; and
- a second inverter having an input receiving said inverted input signal, an output coupled to said second node, and supply inputs coupled between said first and second supply voltages.

6. The level shifter circuit of claim 1, wherein said level shifter circuit comprises a selected one of an up-shift circuit and a down-shift circuit, wherein for said up-shift circuit, said fourth supply voltage has a larger magnitude than said second supply voltage and said third supply voltage has a larger magnitude than said first supply voltage, and wherein for said down-shift circuit, said first supply voltage has a larger magnitude than said third supply voltage and said second supply voltage has a larger magnitude than said fourth supply voltage.

7. The level shifter circuit of claim 1, wherein said first circuit comprises:
- a first P-channel device having a gate receiving said input signal, a source coupled to said first voltage supply and a drain coupled to said first node;
- a first inverter having an input receiving said input signal, an output coupled to said first node, and supply inputs coupled between said first and second supply voltages;
- a second P-channel device having a gate coupled to said output of said first inverter, a source coupled to said first supply voltage and a drain coupled to said second node; and
- a second inverter having an input coupled to said output of said first inverter, an output coupled to said second node, and supply inputs coupled between said first and second supply voltages.

8. The level shifter circuit of claim 1, wherein said protection layer comprises:
- a first N-channel device having a gate receiving said third supply voltage, a source coupled to said third node and a drain;
- a first P-channel device having a gate receiving a reference voltage, a source coupled to said first node and a drain coupled to said drain of said first N-channel device;
- a second N-channel device having a gate receiving said third supply voltage, a source coupled to said fourth node and a drain; and
- a second P-channel device having a gate receiving said reference voltage, a source coupled to said second node and a drain coupled to said drain of said second N-channel device.

9. The level shifter circuit of claim 1, wherein said first circuit comprises:
- a first P-channel device having a gate receiving a non-inverted input signal, a source coupled to said first voltage supply and a drain coupled to said first node;
- a first inverter having an input receiving said non-inverted input signal, an output coupled to said first node, and supply inputs coupled between said first and second supply voltages;
- a second P-channel device having a gate receiving an inverted input signal, a source coupled to said first supply voltage and a drain coupled to said second node; and
- a second inverter having an input receiving said inverted input signal, an output coupled to said second node, and supply inputs coupled between said first and second supply voltages.

10. A voltage shift circuit, comprising:
- a first plurality of voltage level shifter circuits coupled in cascade, including a first level shifter circuit having an input receiving a first input signal switched between first and second voltages collectively having a first common mode voltage and having a first voltage difference that is within a predetermined maximum voltage difference, and including a last level shifter circuit having an output providing a first drive signal that is switched between third and fourth voltages collectively having a second common mode voltage and having a second voltage difference that is within said predetermined maximum voltage difference; and wherein said first common mode voltage is different from said second common mode voltage and wherein a full voltage difference across said first and fourth voltages is greater than said predetermined maximum voltage difference.

11. The voltage shift circuit of claim 10, wherein each of said first plurality of cascaded voltage level shifter circuits comprises:

an input circuit that switches first and second nodes to opposite states within a first voltage range in response to an input signal;

an isolation layer that couples said first and second nodes to third and fourth nodes via first and second isolation paths, respectively; and an output circuit comprising cross-coupled inverters that switch said third and fourth nodes to opposite states within a second voltage range in response to switching of said first and second nodes;

wherein said first and second voltage ranges each have different common mode voltages and each have voltage differences that are within said predetermined maximum voltage difference.

12. The voltage shift circuit of claim 11, wherein at least one of said first plurality of cascaded voltage level shifter circuits comprises a complementary voltage level shifter circuit comprising a first inverter having an input receiving a non-inverted input signal and an output driving said first node of said complementary voltage level shifter circuit and a second inverter having an input receiving an inverted input signal and an output driving said second node of said complementary voltage level shifter circuit, and wherein said third and fourth nodes of said complementary voltage level shifter circuit collectively comprise a complementary output.

13. The voltage shift circuit of claim 10, wherein each of said first plurality of voltage level shifter circuits comprise only thin gate-oxide devices in which a single one of said thin gate-oxide devices is suitable for said predetermined maximum voltage difference and is not suitable for said full voltage difference.

14. The voltage shift circuit of claim 10, wherein said first plurality of voltage level shifter circuits comprise a selected one of an up-shift circuit in which said second common mode voltage is greater than said first common mode voltage and a down-shift circuit in which said first common mode voltage is greater than said second common mode voltage.

15. The voltage shift circuit of claim 10, further comprising:

an input circuit having an input receiving a digital signal and outputs providing said first input signal and a second input signal, wherein said first and second input signals collectively represent said digital signal;

a second plurality of voltage level shifter circuits coupled in cascade, including a first level shifter circuit having an input receiving said second input signal switched within said predetermined maximum voltage difference, and including a last level shifter circuit having an output providing a second drive signal that is switched within said predetermined maximum voltage difference; and an output circuit including first and second inputs receiving said first and second drive signals, respectively, and an output that switches an output node across said full voltage difference.

16. The voltage shift circuit of claim 15, wherein said first and second plurality of voltage level shifter circuits comprises a same number of voltage level shifter circuits coupled in cascade to minimize a timing difference between said first and second drive signals.

17. A method of voltage shifting a signal, comprising:

providing a first circuit that switches first and second nodes within a first voltage range to opposite states in response to an input signal;

coupling the first node to a third node through a first isolation path which keeps the first node within the first voltage range and which keeps the third node within a second voltage range;

coupling the second node to a fourth node through a second isolation path which keeps the second node within the first voltage range and which keeps the fourth node within the second voltage range; and cross-coupling inverters between the third and fourth nodes and powering the inverters within the second voltage range for providing a second circuit coupled to the third and fourth nodes which switches the third and fourth nodes to opposite states within the second voltage range in response to switching of the first and second nodes.

18. The method of claim 17, wherein said providing a first circuit comprises:

providing a first inverter powered within the first voltage range that switches the first node to an opposite state of a non-inverted input signal; and providing a second inverter powered within the first voltage range that switches the second node to an opposite state of an inverted input signal.

* * * * *

UNITED STATES PATENT AND TRADEMARK OFFICE
CERTIFICATE OF CORRECTION

PATENT NO. : 7,268,588 B2  Page 1 of 1
APPLICATION NO. : 11/170398
DATED : September 11, 2007
INVENTOR(S) : Hector Sanchez et al.

It is certified that error appears in the above-identified patent and that said Letters Patent is hereby corrected as shown below:

On the title page,

Inventor Zinghai of Cedar Park, Texas is a citizen of China not the US.

Signed and Sealed this

Fourth Day of December, 2007

JON W. DUDAS
*Director of the United States Patent and Trademark Office*